(12) United States Patent
Jamkhandi

(10) Patent No.: US 7,293,214 B2
(45) Date of Patent: Nov. 6, 2007

(54) TESTABLE DESIGN METHODOLOGY FOR CLOCK DOMAIN CROSSING

(75) Inventor: Piyush Jamkhandi, Milpitas, CA (US)

(73) Assignee: Broadcom Corporation, Irvine, CA (US)

( * ) Notice: Subject to any disclaimer, the term of this patent is extended or adjusted under 35 U.S.C. 154(b) by 175 days.

(21) Appl. No.: 11/294,761

(22) Filed: Dec. 2, 2005

(65) Prior Publication Data
US 2007/0130492 A1 Jun. 7, 2007

(51) Int. Cl.
*G06F 11/00* (2006.01)
*H04L 7/00* (2006.01)

(52) U.S. Cl. .......................... 714/744; 714/798; 375/354

(58) Field of Classification Search ...................... None
See application file for complete search history.

(56) References Cited

U.S. PATENT DOCUMENTS 5,987,081 A * 11/1999 Csoppenszky et al. ...... 375/354
6,260,152 B1 * 7/2001 Cole et al. ................... 713/400
2007/0008758 A1 * 1/2007 Waldrop ........................ 365/5

* cited by examiner

*Primary Examiner*—Christine T. Tu
(74) *Attorney, Agent, or Firm*—Garlick Harrison & Markison

(57) ABSTRACT

A design methodology to debug synchronization of a signal crossing clock domains. A testable synchronization control logic utilizes a programmable register to set parameters to test signals traversing from one clock domain to another clock domain across a synchronization circuit. The register is programmed with a latency value that corresponds to a correct synchronization timing for the clock domain crossing. Other bit entries in the register provide setting of other debug parameters and indications of monitored results.

20 Claims, 5 Drawing Sheets

TESTABLE DESIGN METHODOLOGY FOR CLOCK DOMAIN CROSSING

BACKGROUND OF THE INVENTION

1. Technical Field of the Invention

The embodiments of the invention relate to testing methodology and, more particularly, to test signals crossing clock domains.

2. Description of Related Art

When an integrated circuit (IC) is manufactured, the IC chip undergoes a variety of testing to validate the design of the chip. For complex silicon chips, silicon debugging is one of the more difficult of system designs, due to inherent lack of visibility into the design state. In order to facilitate the performing of the debug procedures, various test and debug structures are designed into the IC. These test and debug structures are then accessed during a debug phase when testing the IC.

Although many such test and debug structures may be present in a chip, most are designed to address debugging within a single clock domain. For logic signals that traverse clock domains, single domain test structures may not allow for the debugging of designs and functionality of synchronizing circuits that are used to control the signal traversal from one clock domain to another clock domain. Since multiple layers of logic complexity may be designed on top of some synchronizing circuits, debugging and testing of synchronizing logic circuitry is difficult to achieve when debug procedures are limited to looking at signals in a single clock domain.

Furthermore, synchronization logic circuits are generally not testable directly through software. During functional testing, it is not possible to determine directly as a part of the functional test, whether a logic state traversal occurs properly across the clock domains bridged by the synchronizing circuit. In some ICs, scannable registers are employed to scan in and scan out a signal, but theses scan-ins and scan-outs are obtained through Joint Test Action Group (JTAG) scanning tools and then checked for consistency. However, such scan techniques do not offer a fine enough granularity at a logic level of the synchronizing circuit to determine if exactly one traversal occurred consistently. This is especially true when the latency across the synchronization point varies due to the clock ratio relationships across the clock domains.

Accordingly, it would be advantageous to have a test methodology that assesses the synchronization logic that controls clock domain crossings, as well as to provide a flexible way of repeating the test across the clock domains as the setup changes, when clock ratio relationship across the synchronizing circuit also change.

SUMMARY OF THE INVENTION

The present invention is directed to apparatus and methods of operation that are further described in the following Brief Description of the Drawings, the Detailed Description of the Embodiments of the Invention, and the Claims. Other features and advantages of the present invention will become apparent from the following detailed description of the embodiments of the invention made with reference to the accompanying drawings.

DETAILED DESCRIPTION OF THE EMBODIMENTS OF THE INVENTION

The embodiments of the present invention may be practiced in a variety of settings that implement multiple clock domains. The examples below describe embodiments of the invention in which at least two different clock domains are resident on an integrated circuit device and bridged by a synchronization circuit. However, other embodiments may be employed in which other circuits are used to transfer a signal across clock domains.

Figure 1:
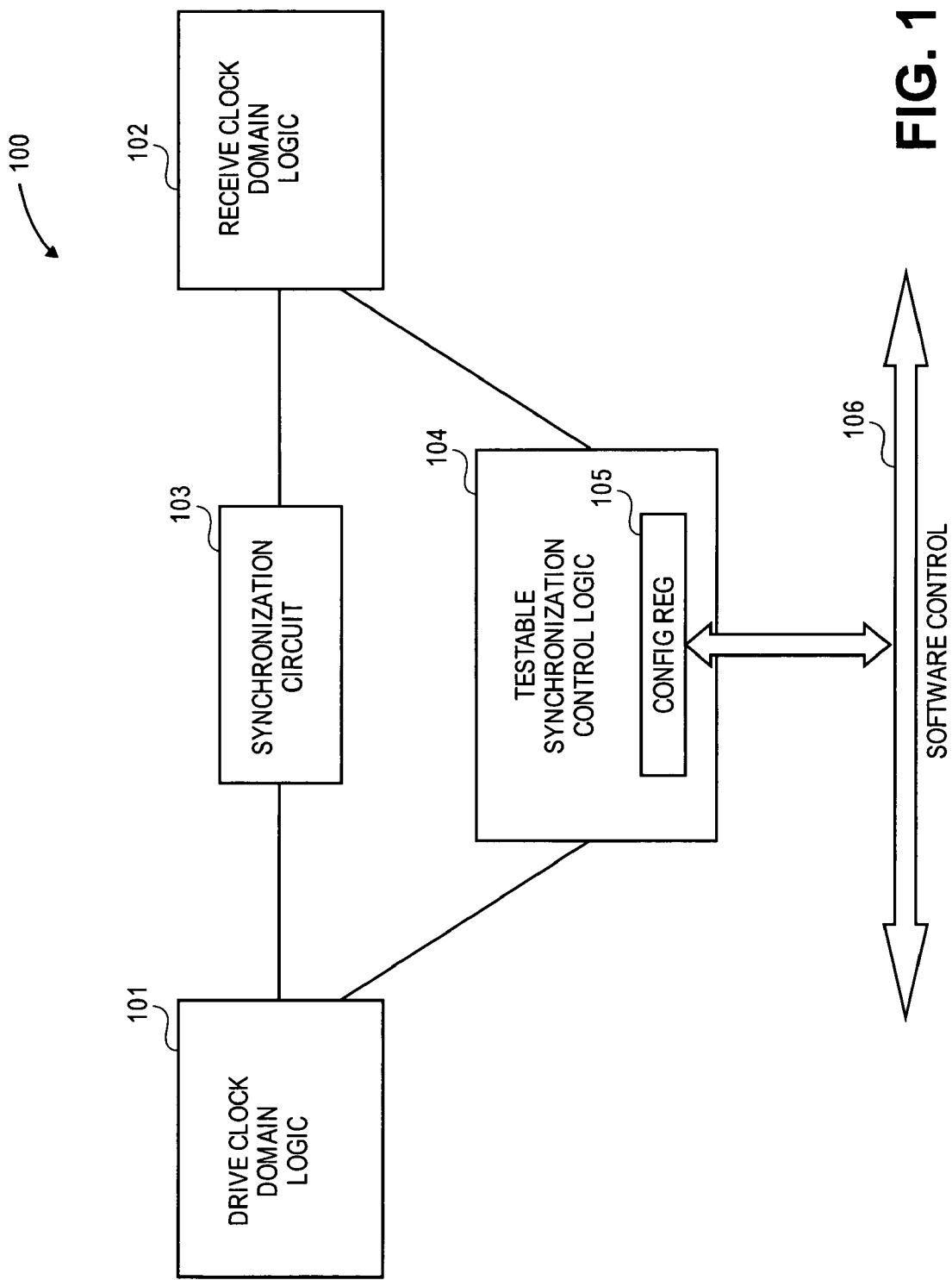
FIG. 1 is a block schematic diagram of an example embodiment of an integrated circuit that utilizes a testable synchronization control logic circuit for testing a signal transfer across clock domains.

Referring to FIG. 1, an example circuit 100 is shown. Circuit 100 is part of an integrated circuit (IC), in which the IC includes various other circuitry (not shown) as well. The exemplary circuit 100 is shown having two clock domains. The IC may have more than two clock domains, but only two are shown for illustrative purpose in FIG. 1. A drive clock domain logic 101 operates in a first clock domain and a receive clock domain logic 102 operates in a second clock domain. A synchronization circuit 103 is coupled to both clock domain logics 101, 102 in order to synchronize a signal traversing from drive clock domain logic 101 to receive clock domain logic 102.

Drive clock domain logic operates in a clock domain, in which a clocking signal of that domain has a first clock frequency. The first clock frequency is used to drive a signal in logic 101. Likewise, receive clock domain logic operates in a clock domain, in which a clocking signal of that domain has a second clock frequency. The second clock frequency is used to receive a signal in logic 102. The frequency of the first clock domain may be greater, lesser or equal to the frequency of the second clock domain.

Synchronization circuit 103 operates to interface the two clock domains and, in particular, the transfer of a signal from logic 101 to logic 102. Synchronization circuit 103 controls the timing synchronization to ensure that the driven signal from circuit 101 is correctly captured by logic 102. A variety of synchronizers may be utilized for synchronization circuit 103. In some embodiments, synchronization circuit 103 may be referred to as a "gearbox" in which the gearbox may be adjustable and/or programmable to accommodate changes to the frequency ratio between the two clock domains. It is to be noted that logics 101, 102 and synchronization circuit 103 are utilized during normal operation of the IC.

Example circuit 100 also includes a testable synchronization control logic 104 that is used for performing a diagnostic function on the IC. Control logic 104 is generally used during a testing or debugging operation of the IC. A typical debug operation for the IC is during initial debugging of the chip after the IC is manufactured. However, in other embodiments, test/debug operations may be performed at other times and also may be adapted to perform diagnostics during normal operation of the IC.

Testable synchronization control logic 104 is coupled to both of the clock domain logics 101, 102 for receiving various signals from the two clock domains. Although shown apart from synchronization circuit 103 in FIG. 1, control logic 104 may be designed as part of synchronization circuit 103. Synchronization control logic 104 includes a configuration register 105, which may also be referred to as a synchronization control register. Although shown as a register, various other storage devices may be implemented to perform the programmable and storage functions of configuration register 105. Configuration register 105 is accessible by software control and in FIG. 1, the software control access to register 105 is achieved through bus 106. The software control access to register 105 allows for programming of register 105, as well as reading values stored in register 105 during debugging of the IC.

Testable synchronization control logic 104 provides for a design methodology to access logics 101, 102 with minimal intrusion to obtain visibility of signal traversal across the two clock domains through synchronization circuit 103. Typically, synchronization control logic 104 is set to operate within the clock domain of logic 101, since a signal is driven from this clock domain. Control logic 104 monitors a test signal generated in logic 101 when the test signal is driven to synchronization circuit 103. Control logic 104 also detects reception (or lack of reception) of the test signal in logic 102 and determines if the reception of the test signal is within an acceptable parameter. Programmability of configuration register 105 allows various debug parameters to be set by software control and results may also be read out from register 105. One of the parameters monitored may be a latency attributed to the signal traversal from logic 101 to logic 102. Accordingly, in one embodiment, a programmable control structure for debugging of a clock domain crossing is provided by configuration register 105.

Figure 2:
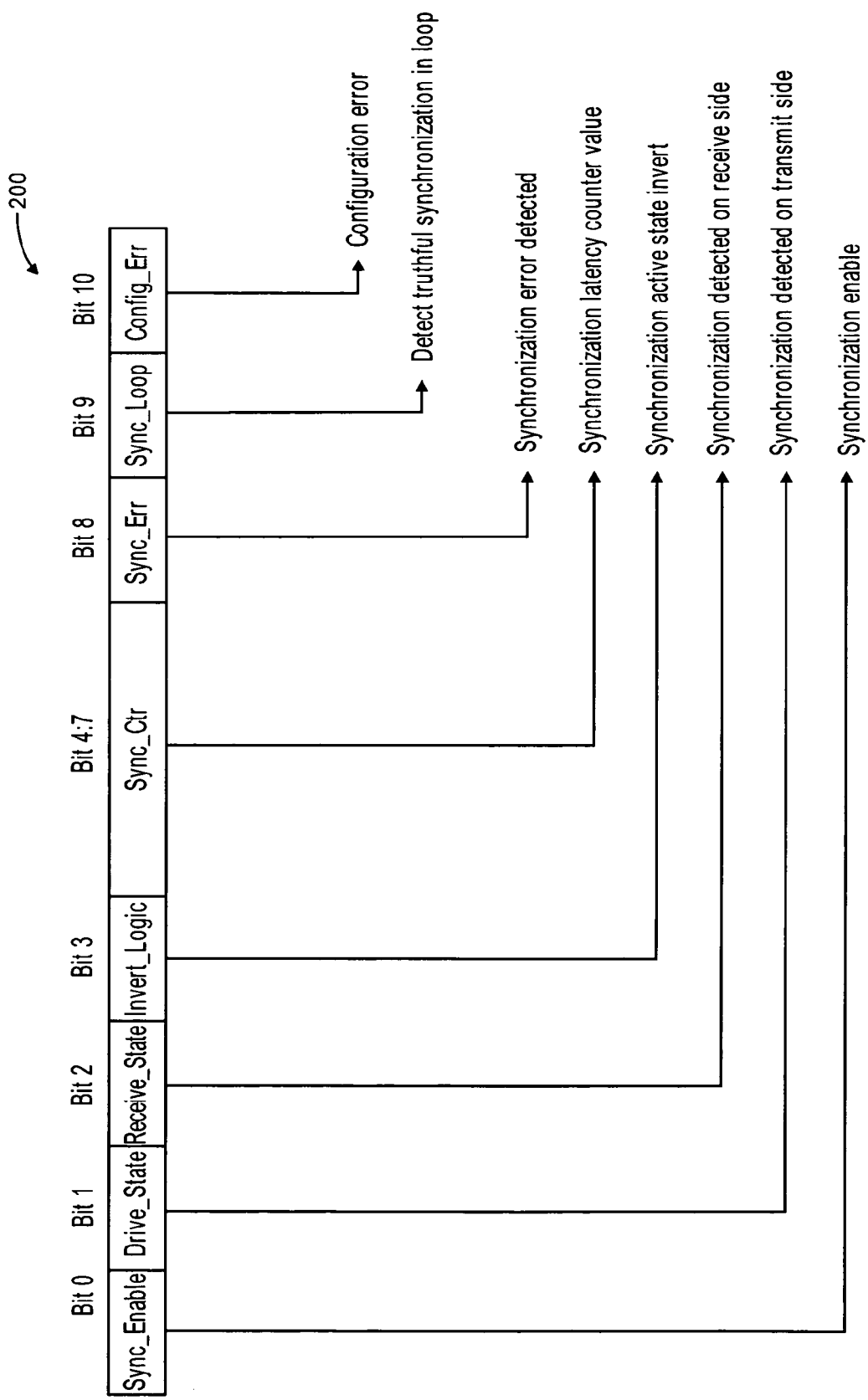
FIG. 2 is a diagram showing an example embodiment of a configuration register used in the synchronization control logic of FIG. 1.

Although configuration register 105 may take various forms, one embodiment for register 105 is shown as synchronization test control register 200 in FIG. 2. A particular bit pattern used with register 200 of FIG. 2 is also described with reference to Table 1 shown below. In Table 1, the first column identifies the bit number; the second column identifies an operation that may be performed on the particular bit by software control; the third column identifies a default value for the particular bit at reset or initialization of the IC; the fourth column identifies the particular bit reference; and the fifth column identifies the description performed by the particular bit.

TABLE 1

| Bit # | Bit Operation | Default Value | Bit Reference | Description |
|---|---|---|---|---|
| 0 | Read/Write | "0" | Sync_Enable | Enable debug feature to log correct logic signal state traversal across synchronization point |
| 1 | Read Only | "x" | Drive_State | Active state of signal detected in the driving clock domain |
| 2 | Read Only | "x" | Receive_State | State of signal detected in the receiving clock domain |
| 3 | Read/Write | "0" | Invert_Logic | Invert Active state of the logic signal |

TABLE 1-continued

| Bit # | Bit Operation | Default Value | Bit Reference | Description |
|---|---|---|---|---|
| 4:7 | Read/Write | "0000" | Sync_Ctr | Counter value to define the latency of the synchronization logic circuit. |
| 8 | Read/Clear | "0" | Sync_Err | Status bit to indicate the traversal of the Active logic state. '1' indicates an error, otherwise the synchronization logic circuit is functional. Functionally this bit is the XOR of Bit[1] and Bit[2] i.e. Bit[8] = Bit[1] XOR Bit[2]. |
| 9 | Read/Write | "0" | Sync_Loop | Continue to detect signal traversal after the first detection. When '0', the logic stops detection of subsequent Active logic traversals, otherwise will continually detect Active logic traversals. |
| 10 | Read Only | "x" | Config_Err | Configuration error detected in the configuration register. |

The description of the various bits (Bits [0:10]) of register 200 are as follows:

Bit[0] is designated as a synchronization control logic enabling bit (Sync_Enable) to control enable/disable status of the synchronization test mode which enables control logic 104. When this bit is disabled (Bit[0]='0'), which is the default value, the remaining bits are ignored. When this bit is enabled (Bit[0]='1'), the operation of synchronization control logic 104 is enabled based on the values of the other bits as noted below. Bit[0] may be written into to set the enable/disable status.

Bit[1] is designated as a drive state bit (Drive_State) to indicate when a test signal is generated in logic 101. When a driven test signal is detected from logic 101, control logic 104 detects the test signal and loads the active logic state of the signal for Bit[1]. A '1' value is loaded when the active logic state is a '1' and '0' value is loaded when the active logic state is a '0'. In this particular embodiment, this bit may only be read and not written into by the software control through bus 106.

Bit[2] is designated as a receive state bit (Receive_State) to indicate a reception (or lack of reception) of the test signal in logic 102. This bit operates similar to Bit[1] but the active response is for reception of the test signal subsequent to the clock domain crossing. In this particular embodiment, this bit may also only be read and not written into by the software control through bus 106.

Bit[3] is designated as an invert logic bit (Invert_Logic) to indicate whether '0' or '1' logic state is the active state for the test signal. Bit[3] determines the active state value for Bit[1] and Bit[2]. If Bit[3] has a '1' value, then a logic state crossing of '1' is monitored for Bits[1:2]. If Bit[3] has a '0' value, then a logic state crossing of '0' is monitored for Bits[1:2]. Bit[3] may be programmed through software control to set the active logic state value for the test signal.

Bits[4:7] are designated as a synchronization counter bit (Sync_Ctr). In this embodiment, four bits are utilized to set one of sixteen binary values. The values correspond to an amount of latency of traversal expected for the test signal. This latency value determines at which cycle the receive side logic should receive the test signal. Once the active logic state is detected on the drive side (Bit[1]), a counter begins to count (either up or down) to the latency value specified by Bits[4:7] and then captures the value of the receive side signal state a cycle later as Bit[2]. As long as the latency value specified by Bits[4:7] is within design specifications for the synchronization circuit 103, the value captured as Bit[2] should be the same as Bit[1], if the synchronization circuit 103 is working properly. These latency bits, Bits[4:7], are programmable by software control. It is to be noted that this embodiment uses four bits, but other embodiments may use more than four bits or less than four bits to specify the granularity of the latency desired.

Bit[8] is designated as a synchronization error bit (Sync_Err). This bit is set to '1' if Bit[1] and Bit[2] states do not match at the conclusion of the latency count sequence described above in reference to Bits[4:7], thereby indicating an error in the crossing. In one embodiment Bit[1] and Bit[2] are exclusively OR'ed (XOR) to signify a match/unmatch condition. When an error condition is detected for the domain crossing of the test signal, a '1' indication is noted for Bit[8]. This bit may be cleared to the '0' state by software control. In one embodiment, writing a '1' to this bit position, clears Bit[8] to the default state of '0'.

Bit[9] is designated as a synchronization loop bit (Sync_Loop). This bit allows a continual detection/reset/detection cycle until no more active logic states are traversing the synchronization circuit 103. Setting this bit allows the test mode to be on for normal functional tests and software may check the status for multiple signal crossings. This bit may be written by software control.

Bit[10] is designated as a configuration error detection bit (Config_Err). This bit is set by the control logic 104 when a configuration error is detected in the test control register 200. A variety of configuration errors may be detected. In the particular embodiment, Bit[10] is used to indicate incorrect configuration of the latency timer. When the test mode is turned on, the default value of the latency counter is '0000' for Bits[4:7], which indicates a zero delay through the synchronization control logic 104. This is noted as an error condition. Until the latency counter is reprogrammed to a value greater than zero (or some other designated minimum value), the error is noted by setting Bit[10] to '1', which has the same effect as setting Bit[0] to '0'.

Figure 3:
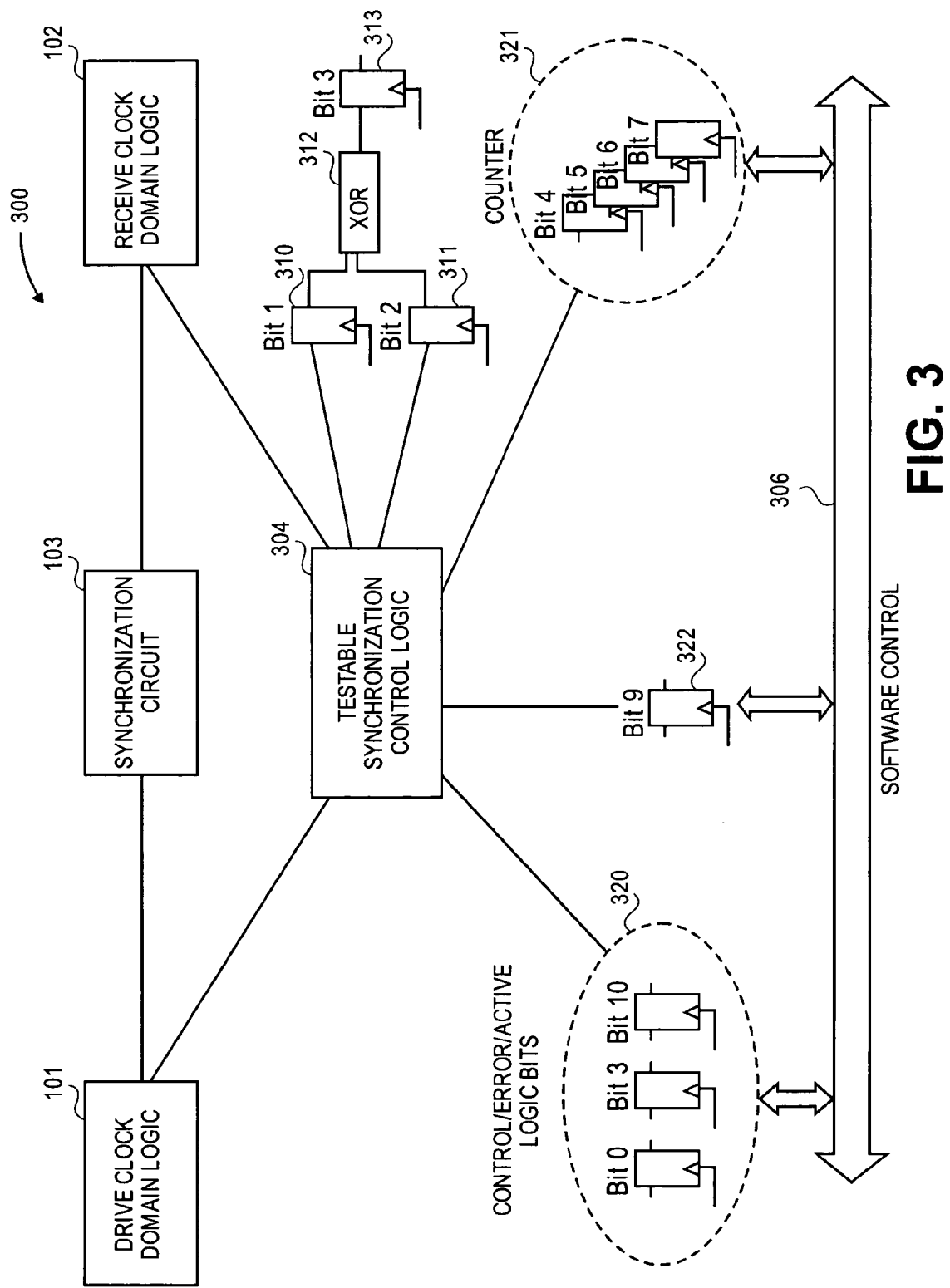
FIG. 3 is a block schematic diagram showing one embodiment for implementing the testable synchronization circuit of FIG. 1 by use of the configuration register bit layout of FIG. 2.

Thus, by utilizing a configuration register, software programming of the register allows certain parameters to be set to perform debug operations when the test mode is selected. It is to be noted that various hardware present in synchronization control logic 104 are not shown in detail, since these circuitry may vary from circuit to circuit. The design for the configuration register 105 may vary as well. FIG. 3 shows one embodiment that uses latches for implementing test control register 200.

Circuit 300 is equivalent to circuit 100 of FIG. 1 but various latches are now used for register 105, based on the register format for register 200 of FIG. 2. Accordingly, latches 310, 311 correspond to Bits[1:2] and the outputs are XOR'ed by XOR circuit 312. The output of XOR circuit 312 is coupled as input to latch 313, which corresponds to Bit[8]. Latches 320 correspond to Bit[0], Bit[3] and Bit[10] and are programmed through bus 306. Latches 321 correspond to Bits[4:7] for programming the latency period. Finally, latch 322 corresponds to Bit[9], which is also programmable as noted above.

Figure 4A:
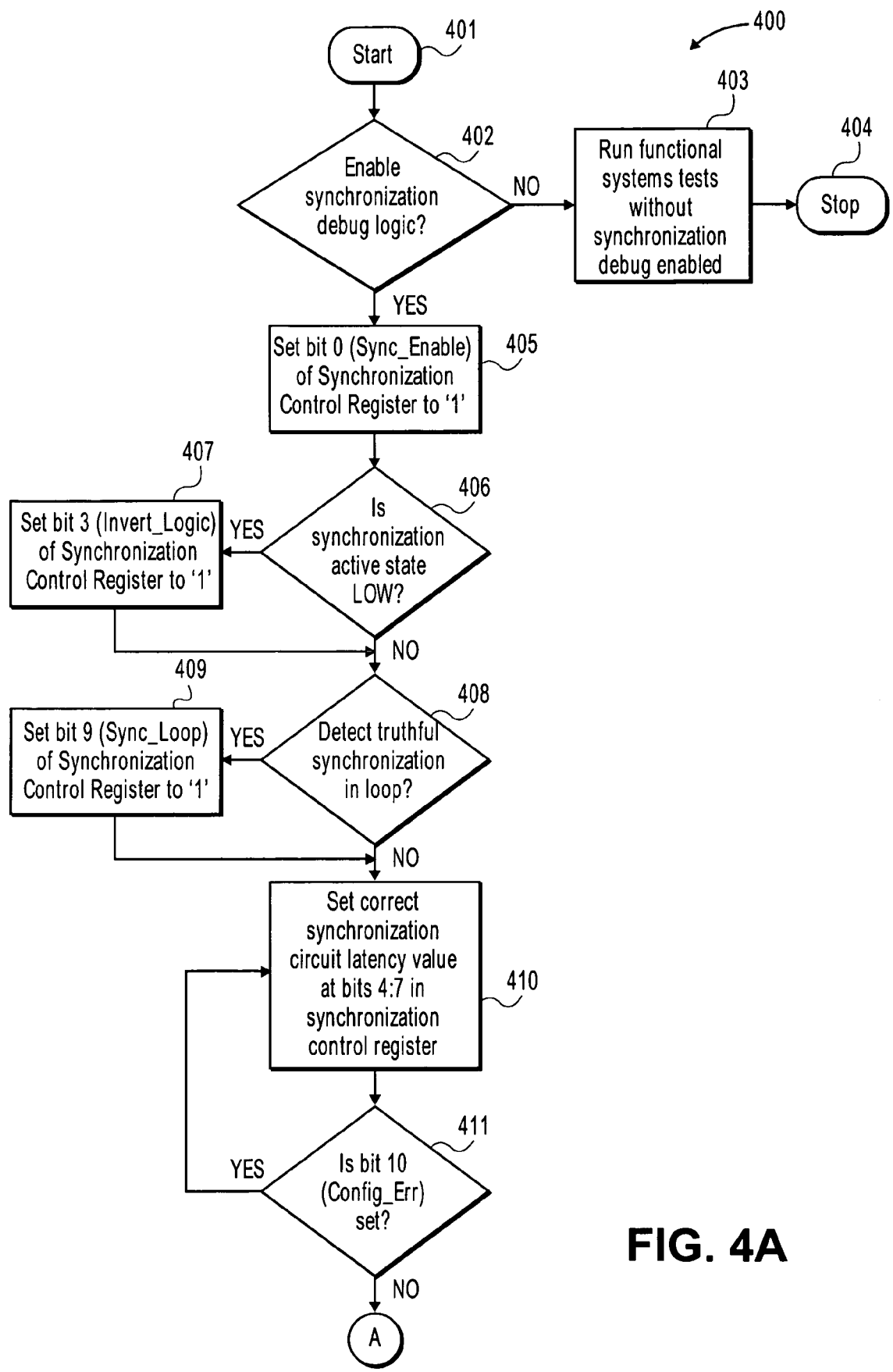
FIG. 4A-B is a flow diagram showing one design methodology for testing an integrated circuit using the control register shown in FIG. 2.
Figure 4B:
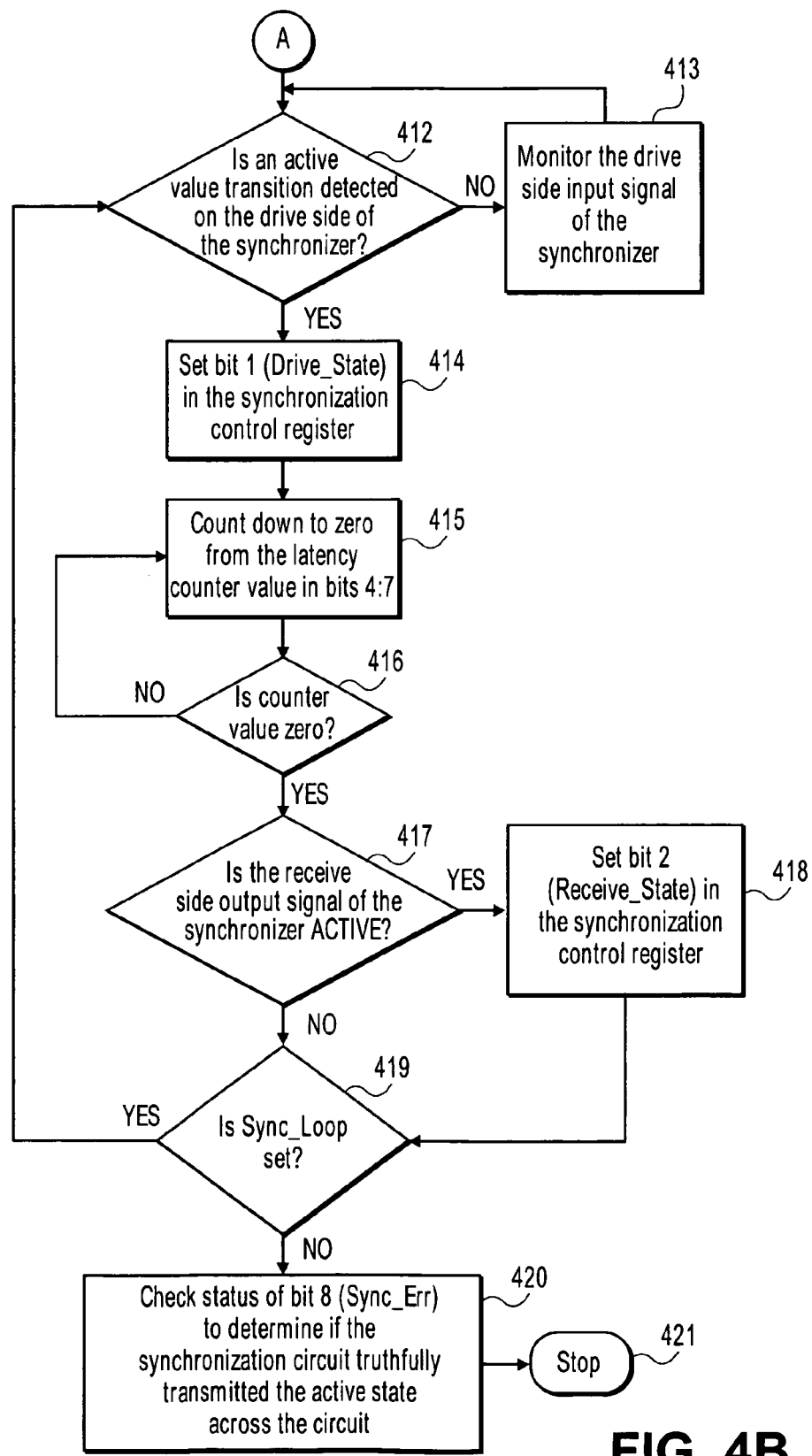

FIG. 4A-B illustrate one exemplary technique for performing a debug test based on the configuration provided by register 200. When a test program commences (block 401), the program may enable synchronization logic 104 (block 402), otherwise other functional system tests are run (blocks 403, 404). If the synchronization debug logic is to be enabled, the program sets Bit[0] to '1' (block 405). Next, if the active state is a 'low' logic state, Bit[3] is set to '1' (blocks 406, 407) If the active state is a 'high' logic state (default state in this embodiment), Bit[3] remains '0' (blocks 406, 408). Then, if the synchronization loop is to be enabled, Bit[9] is set to '1' (blocks 408, 409), otherwise Bit[9] remains '0'. Next, the latency value is programmed into Bits[4:7] (block 410) and a check is made to ensure that Bit[10] does not register an error (block 411). If a configuration error is detected in Bit[10], correct values for Bits[4:7] are programmed. As noted above, in one embodiment, a latency value of '0000' results in an error.

Subsequently, the drive side is monitored for an active value of the test signal (blocks 412, 413) and when detected, Bit[1] is set (block 414). Once the active value of the drive side signal is detected, a latency countdown commences based on the value determined by Bits[4:7] (block 415). When the count reaches zero (counter is count down to zero from the latency value in this embodiment) (block 416), the receive side is monitored for an active state (block 417) and Bit[2] is set (block 418) to the value present when the zero count is reached. If the synchronization loop was set by Bit[9], the program returns to block 412. Finally, Bit[8] is checked to determine if the test signal traversal from the drive clock domain to the receive clock domain occurred in the designated latency period (block 420). The program may end at this point (block421)

It is to be noted that the test method described above is but one example for testing clock domain crossings. Various other methods may be implemented. The testable design methodology described in reference to a testable synchronization control logic circuit allows system designers and/or debuggers to isolate problems with clock domain synchronization independent of other associated logic surrounding the synchronizer. The technique is non-intrusive and employs few bits in a configuration register to test for a single signal or a set of signals traversing the clock domains. The configuration register allows a way to programmably set certain parameters simply by writing to the register.

It is to be noted that other variations may be implemented utilizing other embodiments of the present invention. For example, a bus structure may be compressed into smaller width signals to avoid repetition of the synchronization control logic for all signals of the bus. In some instances a single control signal traversal may suffice for testing. The single test signal may be representative of other signals crossing the same clock domains. As noted earlier in the description, the testable synchronization logic may be implemented within or implemented separately from the actual synchronization circuit.

Thus, a testable design methodology for clock domain crossing is described.

I claim:

1. A method comprising:
    enabling a synchronization control logic coupled between a first clock domain and a second clock domain to test a traversal of a signal across the two clock domains;
    driving the signal from the first clock domain to the second clock domain;
    detecting reception of the signal in the second clock domain; and
    determining if a time lapse between the driving of the signal in the first clock domain and the reception of the signal in the second clock domain is a correct synchronization timing for the signal to cross the two clock domains.

2. The method of claim 1, further including programming the synchronization logic by software control to set parameters to test the traversal of the signal crossing the two clock domains.

3. The method of claim 2, wherein programming the synchronization logic includes programming a register to set parameters to test the signal crossing.

4. The method of claim 2, wherein one of the parameters programmed sets a latency value for the signal to traverse across the clock domains and determining the time lapse for the correct synchronization timing includes ascertaining if the signal crossing occurs at the set latency value.

5. The method of claim 4, further including setting an error indication if the time lapse for the signal to traverse across the clock domains does not correspond to the set latency value.

6. A method comprising:
enabling a synchronization control logic coupled between a first clock domain and a second clock domain to debug a synchronization circuit that synchronizes traversal of a test signal from the first clock domain to the second clock domain;
programming a latency value into a register associated with the synchronization control logic to set a correct synchronization timing for the test signal to traverse across the synchronization circuit;
driving the test signal from the first clock domain to the second clock domain;
counting from an initialization value to the latency value;
detecting if the test signal is received in the second clock domain when the count sequence reaches the latency value; and
indicating an error in the register if the test signal is not received in a clock cycle corresponding to the count sequence reaching the latency value.

7. The method of claim 6 further including setting a first bit in the register to set an active signal state for the test signal, a bit value determining if the active signal state is a logic high or low.

8. The method of claim 7 further including setting a second bit in the register corresponding to an active state of the test signal when driving the test signal to an active state in the first clock domain.

9. The method of claim 8 further including setting a third bit in the register corresponding to a signal state present in the second clock domain when the count sequence reaches the latency value.

10. The method of claim 9 further including comparing the second bit to the third bit to determine if the active signal state is received in the second clock domain in the clock cycle corresponding to the count sequence reaching the latency value.

11. The method of claim 10, wherein the comparing is achieved by exclusive OR'ing the second and third bits and setting a fourth bit in the register as a result of the exclusive OR'ing to provide an error indication.

12. The method of claim 11 further including setting a fifth bit to indicate enabling of the synchronization control logic to perform the debugging.

13. The method of claim 12 further including setting a plurality of bits to set the latency value, in which binary values represented by the plurality of bits correspond to number of clock cycles expended for the correct synchronization timing.

14. The method of claim 12 further including a sixth bit to indicate use and detection of multiple active states traversing across the clock domains.

15. An apparatus comprising:
a synchronization circuit coupled to a first logic in a first clock domain and coupled to a second logic in a second clock domain, the synchronization circuit to provide correct synchronization timing of a signal traversal from the first logic to the second logic; and
a synchronization control logic coupled to the first and second logic and to be enabled during a test procedure to debug the synchronization circuit, the synchronization control logic including a programmable storage device to set parameters for debugging.

16. The apparatus of claim 15, wherein the storage device is a register.

17. The apparatus of claim 16, wherein the register to store a plurality of bits corresponding to a latency value, in which the latency value determines the correct synchronization timing of a test signal crossing from the first clock domain to the second clock domain.

18. The apparatus of claim 17, wherein the register to store a first bit to set an active signal state for the test signal, a value for the first bit to determine if the active signal state is a logic high or low.

19. The apparatus of claim 18, wherein the register to store a second bit corresponding to an active state of the test signal when the first logic drives the test signal to an active state in the first clock domain and the register to store a third bit corresponding to a signal state present in the second logic when a count sequence set by the latency value reaches an end of the count sequence.

20. The apparatus of claim 19, wherein the first bit and the second bit are exclusively OR'ed to provide an error indication.

* * * * *